(12) United States Patent
Kim

(10) Patent No.: US 12,382,803 B2
(45) Date of Patent: Aug. 5, 2025

(54) DRIVING CHIP AND DISPLAY DEVICE INCLUDING THE SAME

(71) Applicant: Samsung Display Co., LTD., Yongin-si (KR)

(72) Inventor: Hyeyoung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/378,891

(22) Filed: Oct. 11, 2023

(65) Prior Publication Data

US 2024/0268166 A1    Aug. 8, 2024

(30) Foreign Application Priority Data

Feb. 8, 2023  (KR) .......................... 10-2023-0016850

(51) Int. Cl.
*H10K 59/131*  (2023.01)
*G09G 3/20*  (2006.01)
*H10K 59/88*  (2023.01)
*H10K 59/90*  (2023.01)

(52) U.S. Cl.
CPC ......... *H10K 59/131* (2023.02); *G09G 3/2007* (2013.01); *G09G 3/2096* (2013.01); *H10K 59/88* (2023.02); *H10K 59/90* (2023.02); *G09G 2320/0233* (2013.01)

(58) Field of Classification Search
CPC ............... G09G 3/2007; G09G 3/2096; G09G 2320/0233; H10K 59/131; H10K 59/88; H10K 59/90
See application file for complete search history.

(56) References Cited

U.S. PATENT DOCUMENTS

2016/0181349 A1*  6/2016  Cho ........................ H10K 59/88
257/40

FOREIGN PATENT DOCUMENTS

KR    1020220093433 A    7/2022

* cited by examiner

*Primary Examiner* — Yaron Cohen
(74) *Attorney, Agent, or Firm* — CANTOR COLBURN LLP

(57) ABSTRACT

A driving chip includes a plurality of output pads arranged along a first direction and a second direction crossing the first direction, where the plurality of output pads outputs a data voltage, and a plurality of dummy pads positioned in the first direction from the plurality of output pads and arranged along the first direction and the second direction. A plurality of adjacent dummy pads adjacent to the plurality of output pads in the first direction, among the plurality of dummy pads, outputs a variable voltage.

19 Claims, 10 Drawing Sheets

FIG. 4
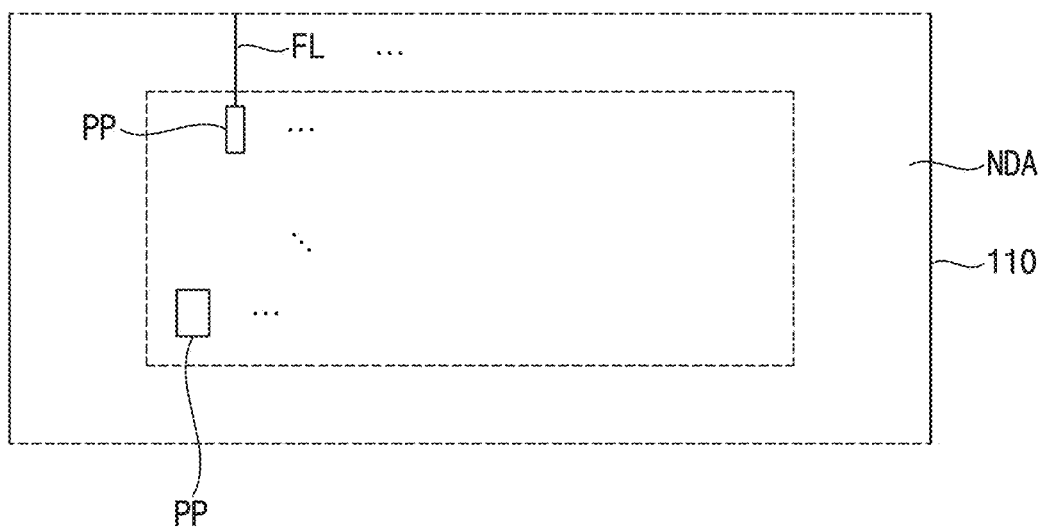
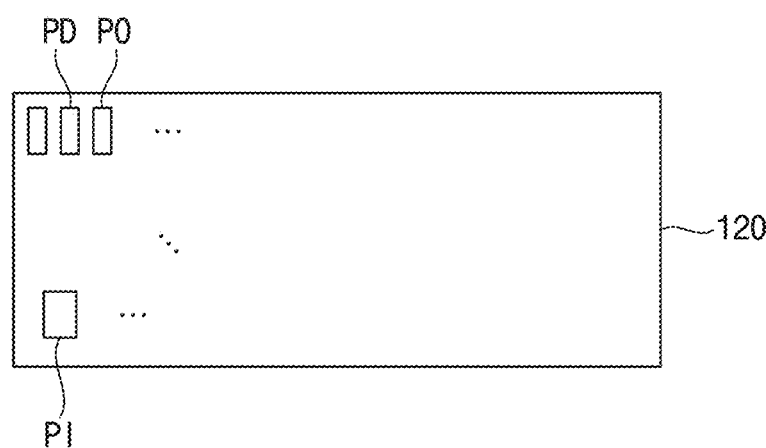

DRIVING CHIP AND DISPLAY DEVICE INCLUDING THE SAME

This application claims priority to Korean Patent Application No. 10-2023-0016850, filed on Feb. 8, 2023, and all the benefits accruing therefrom under 35 U.S.C. § 119, the content of which in its entirety is herein incorporated by reference.

BACKGROUND

1. Field

Embodiments relate to a display device. More particularly, embodiments related to a driving chip providing a data voltage and a display device including the driving chip.

2. Description of the Related Art

A display device may include a display panel including pixels for displaying an image and a driving chip for providing data voltages to the display panel. Output pads of the driving chip may be electrically connected to panel pads of the display panel, respectively.

SUMMARY

In a display device including a display panel and a driving chip, when a contact resistance of output pad of the driving chip increases, a vertical line defect in which pixels electrically connected to the output pad having the increased contact resistance are brightly or darkly viewed may occur. When the vertical line defect occurs, display quality of the display device may deteriorate.

Embodiments provide a driving chip preventing a contact resistance of an output pad from increasing.

Embodiments provide a display device having an improved display quality.

A driving chip according to embodiments includes a plurality of output pads arranged along a first direction and a second direction crossing the first direction, where the plurality of output pads outputs a data voltage, and a plurality of dummy pads positioned in the first direction from the plurality of output pads and arranged along the first direction and the second direction. In such embodiments, a plurality of adjacent dummy pads adjacent to the plurality of output pads in the first direction among the plurality of dummy pads outputs a variable voltage.

In an embodiment, a range of the variable voltage may be equal to a range of the data voltage.

In an embodiment, the plurality of output pads may include an adjacent output pad adjacent to an adjacent dummy pad of the plurality of adjacent dummy pads in the first direction. In such an embodiment, the adjacent dummy pad may output the data voltage corresponding to a white grayscale when the adjacent output pad outputs the data voltage corresponding to a black grayscale.

In an embodiment, the adjacent dummy pad may output the data voltage corresponding to the black grayscale when the adjacent output pad outputs the data voltage corresponding to the white grayscale.

In an embodiment, the adjacent dummy pad may output the data voltage corresponding to an intermediate grayscale between the black grayscale and the white grayscale when the adjacent output pad outputs the data voltage corresponding to the intermediate grayscale.

In an embodiment, the plurality of adjacent dummy pads may include a first adjacent dummy pad, a second adjacent dummy pad, and a third adjacent dummy pad arranged along the second direction. In such an embodiment, the plurality of output pads may include a first output pad, a second output pad, and a third output pad, which are respectively adjacent to the first adjacent dummy pad, the second adjacent dummy pad, and the third adjacent dummy pad in the first direction.

In an embodiment, the first adjacent dummy pad, the second adjacent dummy pad, and the third adjacent dummy pad may respectively output a third data voltage, a first data voltage, and a second data voltage when the first output pad, the second output pad, and the third output pad respectively output the first data voltage, the second data voltage, and the third data voltage.

In an embodiment, the first adjacent dummy pad, the second adjacent dummy pad, and the third adjacent dummy pad may respectively output a second data voltage, a first data voltage, and a third data voltage when the first output pad, the second output pad, and the third output pad respectively output the first data voltage, the second data voltage, and the third data voltage.

In an embodiment, the plurality of output pads may further include a fourth output pad, a fifth output pad, and a sixth output pad respectively adjacent to the first output pad, the second output pad, and the third output pad in the first direction. In such an embodiment, the first adjacent dummy pad, the second adjacent dummy pad, and the third adjacent dummy pad may respectively output a fourth data voltage, a fifth data voltage, and a sixth data voltage when the fourth output pad, the fifth output pad, and the sixth output pad respectively output the fourth data voltage, the fifth data voltage, and the sixth data voltage.

In an embodiment, a plurality of non-adjacent dummy pads other than the plurality of adjacent dummy pads among the plurality of dummy pads may output a ground voltage.

A display device according to embodiments includes a display panel including a plurality of panel pads arranged along a first direction and a second direction crossing the first direction, and a driving chip. In such embodiments, the driving chip includes a plurality of output pads respectively electrically connected to the plurality of panel pads, where the plurality of output pads outputs a data voltage, and a plurality of dummy pads positioned in the first direction from the plurality of output pads and arranged along the first direction and the second direction. In such embodiments, a plurality of adjacent dummy pads adjacent to the plurality of output pads in the first direction among the plurality of dummy pads ay outputs a variable voltage.

In an embodiment, a range of the variable voltage may be equal to a range of the data voltage.

In an embodiment, the plurality of output pads may includes an adjacent output pad adjacent to an adjacent dummy pad of the plurality of adjacent dummy pads in the first direction. In such an embodiment, the adjacent dummy pad may output the data voltage corresponding to a white grayscale when the adjacent output pad outputs the data voltage corresponding to a black grayscale.

In an embodiment, the adjacent dummy pad may output the data voltage corresponding to the black grayscale when the adjacent output pad outputs the data voltage corresponding to the white grayscale.

In an embodiment, the adjacent dummy pad may output the data voltage corresponding to an intermediate grayscale between the black grayscale and the white grayscale when the adjacent output pad outputs the data voltage corresponding to the intermediate grayscale.

In an embodiment, the plurality of adjacent dummy pads may include a first adjacent dummy pad, a second adjacent dummy pad, and a third adjacent dummy pad arranged along the second direction. In such an embodiment, the plurality of output pads may include a first output pad, a second output pad, and a third output pad, which are respectively adjacent to the first adjacent dummy pad, the second adjacent dummy pad, and the third adjacent dummy pad in the first direction.

In an embodiment, the first adjacent dummy pad, the second adjacent dummy pad, and the third adjacent dummy pad may respectively output a third data voltage, a first data voltage, and a second data voltage when the first output pad, the second output pad, and the third output pad respectively output the first data voltage, the second data voltage, and the third data voltage.

In an embodiment, the first adjacent dummy pad, the second adjacent dummy pad, and the third adjacent dummy pad may respectively output a second data voltage, a first data voltage, and a third data voltage when the first output pad, the second output pad, and the third output pad respectively output the first data voltage, the second data voltage, and the third data voltage.

In an embodiment, the plurality of output pads may further include a fourth output pad, a fifth output pad, and a sixth output pad respectively adjacent to the first output pad, the second output pad, and the third output pad in the first direction. In such an embodiment, the first adjacent dummy pad, the second adjacent dummy pad, and the third adjacent dummy pad may respectively output a fourth data voltage, a fifth data voltage, and a sixth data voltage when the fourth output pad, the fifth output pad, and the sixth output pad respectively output the fourth data voltage, the fifth data voltage, and the sixth data voltage.

In an embodiment, a plurality of non-adjacent dummy pads other than the plurality of adjacent dummy pads among the plurality of dummy pads may output a ground voltage.

In the driving chip according to the embodiments, the adjacent dummy pad adjacent to the output pad among the dummy pads may output the variable voltage, so that a contact resistance of the adjacent output pad adjacent to the adjacent dummy pad may not increase.

In the display device according to embodiments, the contact resistance of the adjacent output pad may not increase, so that a vertical line defect in which pixels electrically connected to output pads having increased contact resistance are brightly or darkly viewed may not occur, and a display quality of the display device may be improved.

BRIEF DESCRIPTION OF THE DRAWINGS

Illustrative, non-limiting embodiments will be more clearly understood from the following detailed description taken in conjunction with the accompanying drawings.

FIG. 4 is a plan view illustrating an embodiment in a state where a display panel and a driving chip included in the display device in FIG. 1 are separated.

DETAILED DESCRIPTION

Figure 1:
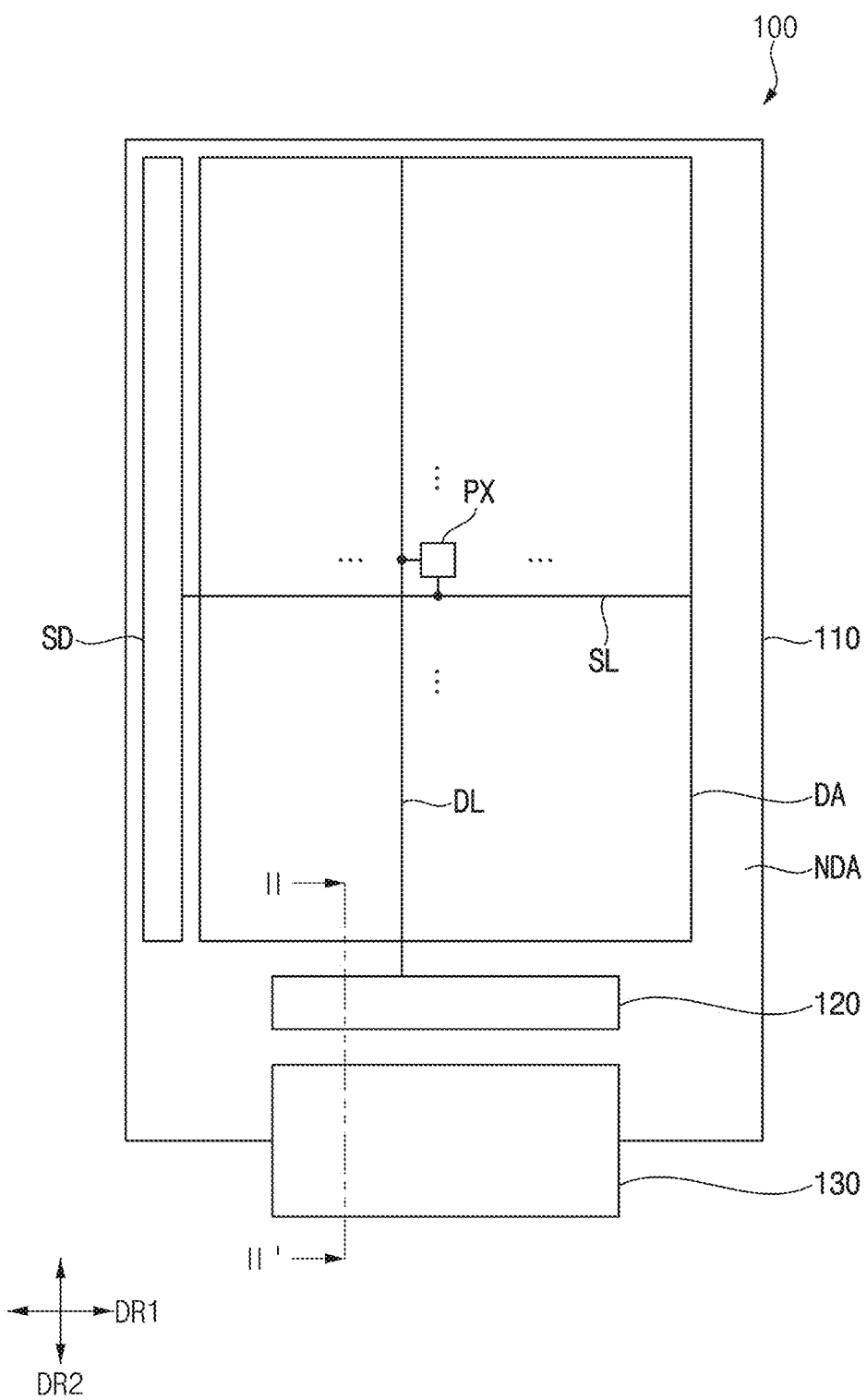
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a driving chip and a display device according to embodiments of the present disclosure will be described in detail with reference to the accompanying drawings. The same or similar reference numerals will be used for the same elements in the accompanying drawings.

FIG. 1 is a plan view illustrating a display device 100 according to an embodiment.

Referring to FIG. 1, an embodiment of the display device 100 may include a display panel 110, a driving chip 120, and a flexible circuit board 130.

In an embodiment, the display panel 110 may have a shape of a rectangle having opposing short sides extending in a first direction DR1 and opposing long sides extending in a second direction DR2 crossing the first direction DR1 in a plan view, i.e., when viewed in a direction perpendicular to the first and second direction DR1 and DR2 or a thickness direction of the display device, but is not limited thereto. In an alternative embodiment, the display panel 110 may have another shape e.g., a polygonal, circular, or elliptical shape, in the plan view.

The display panel 110 may include a display area DA and a non-display area NDA. The display area DA may display an image. The non-display area NDA may be disposed on a periphery of the display area DA. The non-display area NDA may be disposed to surround at least a portion of the display area DA in the plan view. The non-display area NDA may not display an image.

The display panel 110 may include a plurality of pixels PX disposed in the display area DA. The pixels PX may be arranged along the first direction DR1 and the second direction DR2 in the plan view. Each of the pixels PX may be connected to a scan line SL extending in the first direction DR1 and a data line DL extending in the second direction DR2.

Each of the pixels PX may include a pixel circuit and a light emitting element. The pixel circuit may include a plurality of transistors and at least one capacitor. In an embodiment, the light emitting element may be an organic light emitting diode ("OLED"). In an alternative embodiment, the light emitting element may be a micro light emitting diode (micro "LED"), a quantum-dot light emitting diode ("QLED"), an inorganic light emitting diode, or the like.

The display panel 110 may include a scan driver SD disposed in the non-display area NDA. The scan driver SD may be disposed in the first direction DR1 from the display area DA. The scan driver SD may be connected to the scan lines SL. The scan driver SD may provide scan signals to the pixels PX through the scan lines SL. The scan driver SD may include or be implemented by a plurality of transistors and a plurality of capacitors.

The driving chip 120 may be disposed in the non-display area NDA of the display panel 110. The driving chip 120 may be disposed in the second direction DR2 from the display area DA of the display panel 110. The driving chip 120 may be connected to data lines DL. The driving chip 120 may provide data voltages to the pixels PX through the data lines DL. A data driver may include or be implemented by the driving chip 120.

The flexible circuit board 130 may be disposed in the non-display area NDA of the display panel 110. The flexible circuit board 130 may be disposed in the second direction DR2 from the display area DA of the display panel 110. In an embodiment, the flexible circuit board 130 may be disposed in the second direction DR2 from the display area DA of the display panel 110 with the driving chip 120 interposed therebetween. The flexible circuit board 130 may electrically connect the display panel 110 to a printed circuit board (not illustrated).

Figure 2:
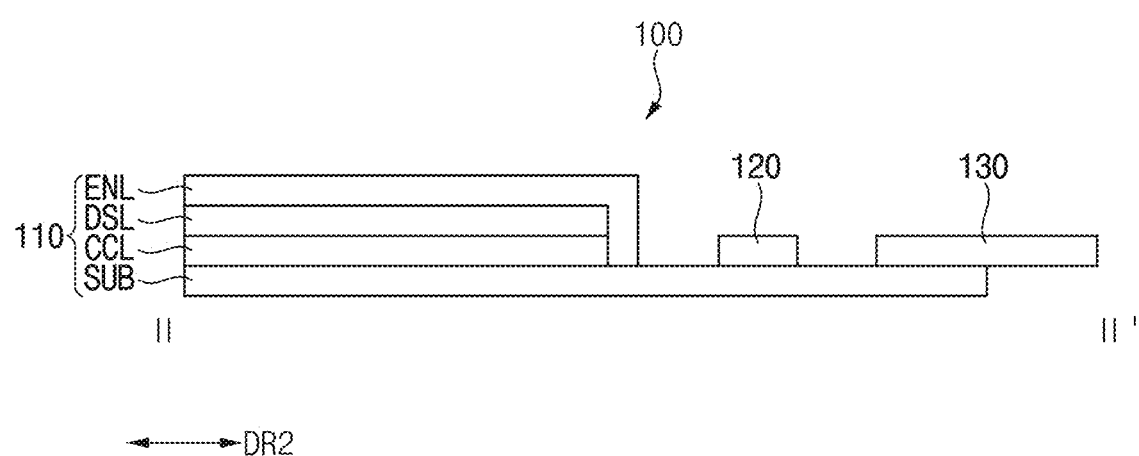
FIG. 2 is a cross-sectional view illustrating the display device taken along line II-II' in FIG. 1.

FIG. 2 is a cross-sectional view illustrating the display device 100 taken along line II-II' in FIG. 1.

Referring to FIG. 2, in an embodiment, the display panel 110 may include a substrate SUB, a circuit layer CCL, a display layer DSL, and an encapsulation layer ENL.

The substrate SUB may include portions corresponding to the display area DA and the non-display area NDA, that is, the display area DA and the non-display area NDA may be defined on the substrate SUB. The substrate SUB may include at least one insulating layer. In an embodiment, the substrate SUB may be a rigid substrate including a hard material such as glass. In an alternative embodiment, the substrate SUB may be a flexible substrate including a flexible material such as polyimide.

The circuit layer CCL may be disposed in the display area DA on the substrate SUB. The circuit layer CCL may include transistors and capacitors included in the scan driver SD, and transistors and at least one capacitor included in the pixel circuit of each of the pixels PX.

The display layer DSL may be disposed in the display area DA on the circuit layer CCL. The display layer DSL may include the light emitting element of each of the pixels PX.

The encapsulation layer ENL may be disposed on the display layer DSL. The encapsulation layer ENL may cover the display layer DSL to protect the display layer DSL. The encapsulation layer ENL may include a plurality of inorganic encapsulation films and at least one organic encapsulation film.

Figure 3:
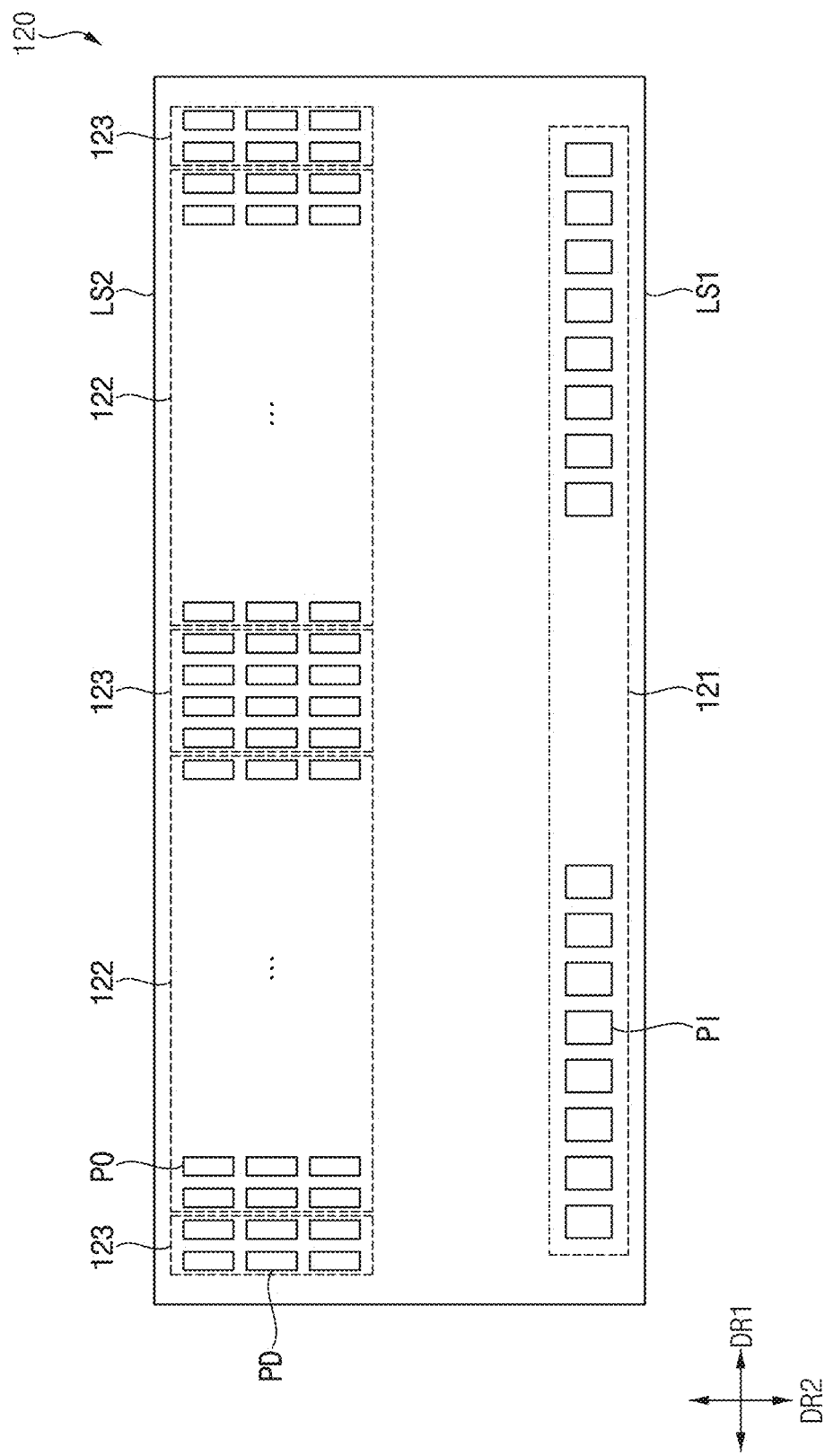
FIG. 3 is a plan view illustrating a driving chip included in the display device in FIG. 1.

FIG. 3 is a plan view illustrating the driving chip 120 included in the display device 100 in FIG. 1.

Referring to FIG. 3, in an embodiment, the driving chip 120 may have a shape of a rectangle having opposing long sides LS1 and LS2 extending in the first direction DR1 and opposing short sides extending in the second direction DR2 in the plan view. The driving chip 120 may include a plurality of input pads PI, a plurality of output pads PO, and a plurality of dummy pads PD.

The input pads PI may be arranged along the first direction DR1. The input pads PI may be disposed in an input pad portion 121. The input pad portion 121 may be disposed adjacent (or close) to a first long side LS1 of the driving chip 120. An input signal of the data driver implemented by the driving chip 120 may be input to each of the input pads PI.

The output pads PO may be arranged along the first direction DR1 and the second direction DR2. The output pads PO may be disposed in an output pad portion 122. The output pad portion 122 may be disposed adjacent (or close) to a second long side LS2 of the driving chip 120 facing the first long side LS1. In an embodiment, the driving chip 120 may include two output pad portions 122. Each of the output pads PO may output the data voltage. In an embodiment, for example, a range of the data voltage may be from about 2 volts (V) to about 6 V.

The dummy pads PD may be positioned in the first direction DR1 from the output pads PO, and may be arranged along the first direction DR1 and the second direction DR2. The dummy pads PD may be disposed in a dummy pad portion 123. The dummy pad portion 123 may be disposed adjacent to the second long side LS2 of the driving chip 120. In an embodiment, the driving chip 120 may include three dummy pad portions 123. In an embodiment, for example, a first dummy pad portion 123 may be positioned outside of a first output pad portion 122 in the first direction DR1, a second dummy pad portion 123 may be positioned outside of a second output pad portion 123 in the first direction DR1, and a third dummy pad portion 123 may be positioned between the first output pad portion 122 and the second output pad portion in the first direction DR1.

FIG. 3 illustrates an embodiment in which the output pads PO and the dummy pads PD are arranged in three rows, but the present disclosure is not limited thereto. In an alternative embodiment, the output pads PO and the dummy pads PD may be arranged in two rows or four or more rows.

In embodiments, each of a plurality of adjacent dummy pads adjacent to the output pads PO in the first direction DR1 among the dummy pads PD may output a variable voltage. In an embodiment, a range of the variable voltage may be substantially equal to the range of the data voltage. In an embodiment, for example, the range of the variable voltage may be from about 2 V to about 6 V. Each of a plurality of non-adjacent dummy pads excluding the adjacent dummy pads among the dummy pads PD may output a ground voltage (e.g., 0 V).

Figure 5:
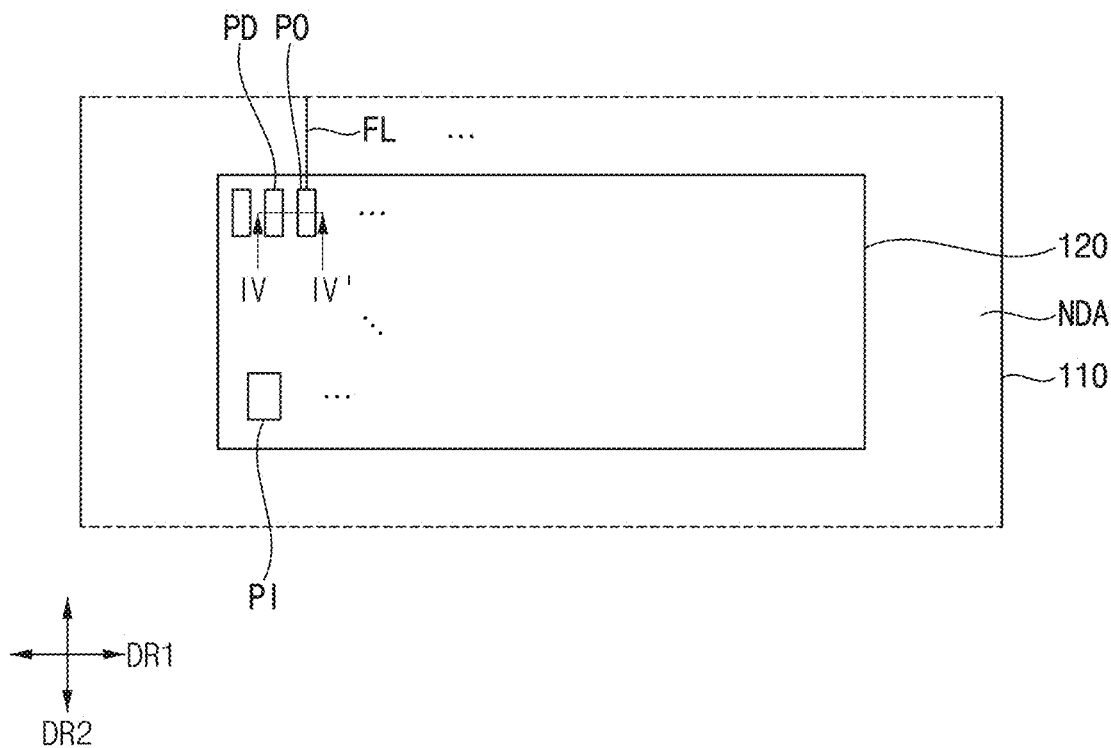
FIG. 5 is a plan view illustrating an embodiment in a state where a display panel and a driving chip included in the display device in FIG. 1 are combined.
Figure 6:
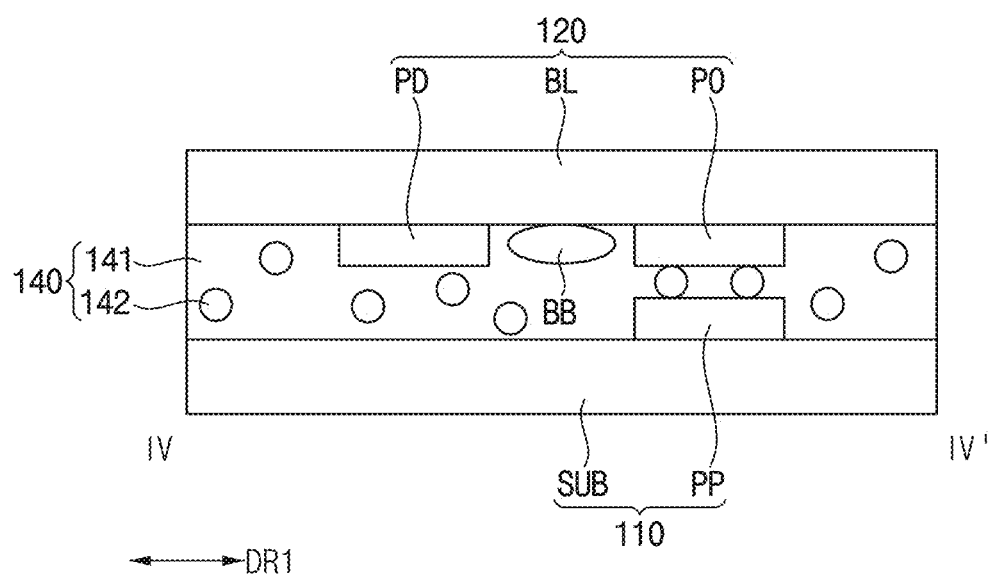
FIG. 6 is a cross-sectional view illustrating the display device taken along line IV-IV' in FIG. 5.

FIG. 4 is a plan view illustrating an embodiment in a state where the display panel 110 and the driving chip 120 included in the display device 100 in FIG. 1 are separated. FIG. 5 is a plan view illustrating the an embodiment in a state where display panel 110 and the driving chip 120 included in the display device in FIG. 1 are combined. FIG. 6 is a cross-sectional view illustrating the display device 100 taken along line IV-IV' in FIG. 5.

Referring to FIGS. 4, 5, and 6, in an embodiment, the display panel 110 may include a plurality of panel pads PP disposed in the non-display area NDA. The panel pads PP may be arranged along the first direction DR1 and the second direction DR2. The panel pads PP may be arranged to correspond to the input pads PI and output pads PO of the driving chip 120, respectively. The panel pads PP may overlap the input pads PI and output pads PO of the driving chip 120, respectively. The panel pads PP may be electrically connected to the input pads PI and output pads PO of the driving chip 120, respectively.

The panel pads PP electrically connected to the output pads PO of the driving chip 120 may be connected to fan-out lines FL, respectively. The fan-out lines FL may be connected to the data lines DL, respectively. In an embodiment, for example, the fan-out lines FL may be respectively connected to the data lines DL near a boundary between the display area DA and the non-display area NDA. Accordingly, the data voltage output from each of the output pads PO of the driving chip 120 may be transmitted to the data line DL through the fan-out line FL.

A conductive adhesive film 140 may be disposed between the display panel 110 and the driving chip 120. The conductive adhesive film 140 may be interposed between the substrate SUB of the display panel 110 and a base layer BL of the driving chip 120. The driving chip 120 may be attached to the display panel 110 by the conductive adhesive film 140. Further, the output pad PO of the driving chip 120 may be electrically connected to the panel pad PP of the display panel 110 by the conductive adhesive film 140.

In an embodiment, as shown in FIG. 6, the conductive adhesive film 140 may include a base resin 141 and a plurality of conductive particles 142 dispersed in the base resin 141.

The base resin 141 may include a thermosetting material. In an embodiment, for example, the base resin 141 may include styrene butadiene, an epoxy resin, a polyurethane resin, an acrylic resin, or the like.

Each of the conductive particles 142 may have a fine size, and may be coated with a conductive material. In an embodiment, for example, each of the conductive particles 142 may have a diameter in a range of about 3 micrometers ($\mu m$) to about 15 $\mu m$, and may be coated with a conductive metal such as gold (Au), nickel (Ni), palladium (Pd), or the like.

In the prior art, each of the output pads PO may output the data voltage, and each of the dummy pads PD may output the ground voltage. When the output pad PO and the dummy pad PD that are adjacent to each other output the data voltage and the ground voltage, respectively, in a high-temperature and high-humidity environment, electrochemical corrosion of the output pad PO adjacent to the dummy pad PD may occur by the ground voltage of the dummy pad PD, and thus, a contact resistance of the output pad PO may increase. Specifically, when a bubble BB is positioned between the output pad PO and the dummy pad PD that are adjacent to each other, the electrochemical corrosion of the output pad PO may be accelerated in the high-temperature and high-humidity environment. When the contact resistance of the output pad PO increases, resistive-capacitive ("RC") delay may occur, and accordingly, a vertical line defect in which the pixels PX electrically connected to the output pad PO having the increased contact resistance are brightly or darkly viewed may occur.

In embodiments of the invention, each of the plurality of adjacent dummy pads adjacent to the output pads PO in the first direction DR1 among the dummy pads PD may output the variable voltage. When the output pad PO and the dummy pad PD that are adjacent to each other output the data voltage and the variable voltage in a range substantially equal to the range of the data voltage, respectively, in the high-temperature and high-humidity environment, the electrochemical corrosion of the output pad PO adjacent to the dummy pad PD may not occur by the variable voltage of the dummy pad PD, and thus, the contact resistance of the output pad PO may not increase. Accordingly, the vertical line defect in which the pixels PX electrically connected to the output pad PO having the increased contact resistance are brightly or darkly viewed may not occur.

Figure 7:
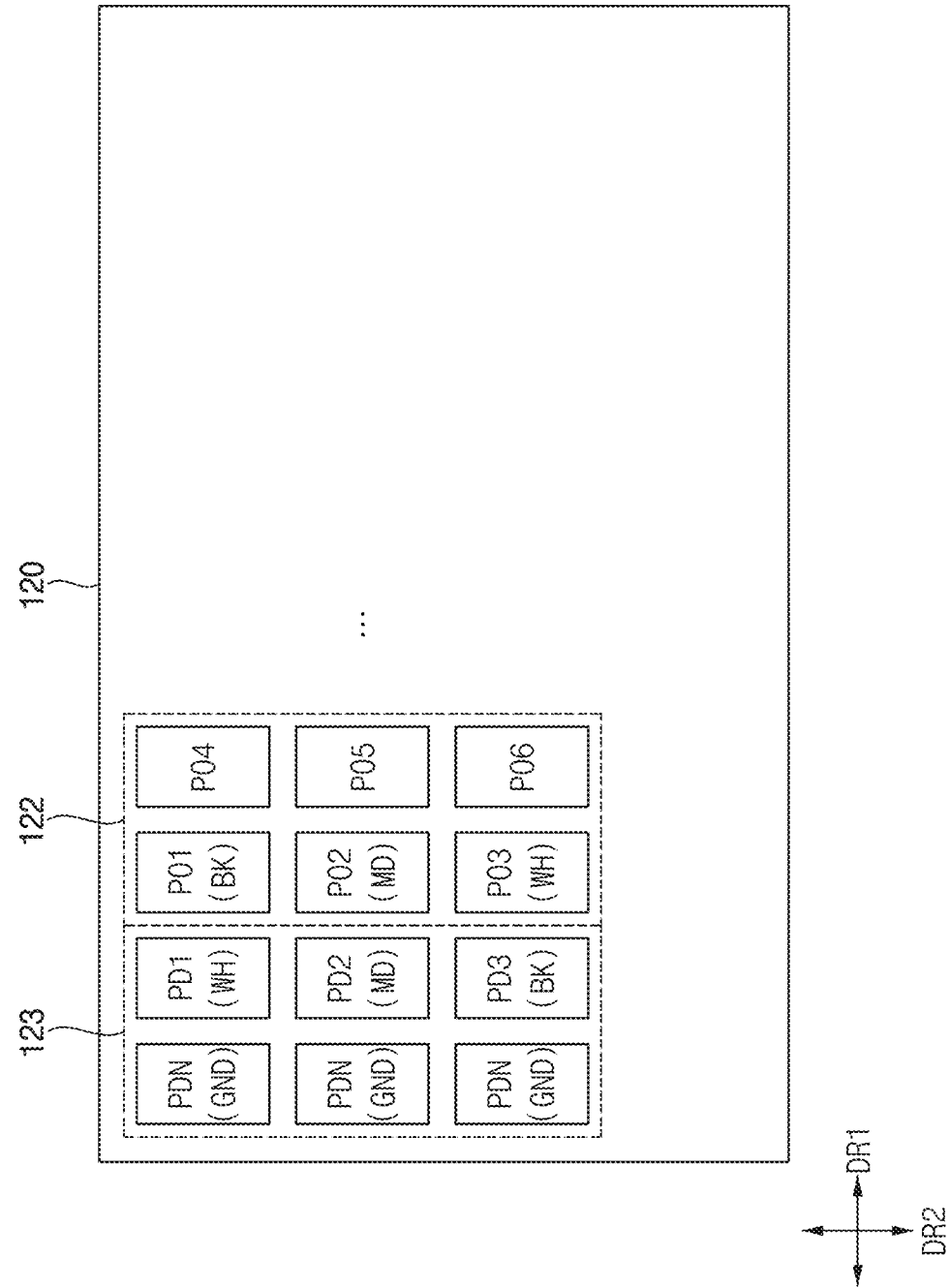
FIG. 7 is a diagram for describing voltages output from dummy pads of a driving chip according to an embodiment.

FIG. 7 is a diagram for describing voltages output from the dummy pads of the driving chip 120 according to an embodiment.

Referring to FIG. 7, in an embodiment, the dummy pads PDN, PD1, PD2, and PD3 may include adjacent dummy pads PD1, PD2, and PD3 adjacent to the output pads PO1, PO2, PO3, PO4, PO5, and PO6 in the first direction DR1 and non-adjacent dummy pads PDN excluding the adjacent dummy pads PD1, PD2, and PD3. The output pads PO1, PO2, PO3, PO4, PO5, and PO6 may include adjacent output pads PO1, PO2, and PO3 adjacent to the adjacent dummy pads PD1, PD2, and PD3 in the first direction DR1. Each of the non-adjacent dummy pads PDN may output the ground voltage GND.

In an embodiment, when an adjacent output pad outputs a data voltage corresponding to a black grayscale BK, an adjacent dummy pad adjacent to the adjacent output pad in the first direction DR1 may output a data voltage corresponding to a white grayscale WH. In an embodiment, for example, as illustrated in FIG. 7, when the first adjacent output pad PO1 outputs the data voltage corresponding to the black grayscale BK, the first adjacent dummy pad PD1 may output the data voltage corresponding to the white grayscale WH. In an embodiment, for example, the data voltage corresponding to the black grayscale BK may be about 6 V, and the data voltage corresponding to the white grayscale WH may be about 2 V.

In an embodiment, when an adjacent output pad outputs a data voltage corresponding to the white grayscale WH, an adjacent dummy pad adjacent to the adjacent output pad in the first direction DR1 may output a data voltage corresponding to the black grayscale BK. In an embodiment, for example, as illustrated in FIG. 7, when the third adjacent output pad PO3 outputs the data voltage corresponding to the white grayscale WH, the third adjacent dummy pad PD3 may output the data voltage corresponding to the black grayscale BK.

In an embodiment, when an adjacent output pad outputs a data voltage corresponding to an intermediate grayscale MD between the black grayscale BK and the white grayscale WH, an adjacent dummy pad adjacent to the adjacent output pad in the first direction DR1 may output a data voltage corresponding to the intermediate grayscale MD. In an embodiment, for example, as illustrated in FIG. 7, when the second adjacent output pad PO2 outputs the data voltage corresponding to the intermediate grayscale MD, the second adjacent dummy pad PD2 may output the data voltage corresponding to the intermediate grayscale MD. In an embodiment, for example, the data voltage corresponding to the intermediate grayscale MD may be about 4 V.

Figure 8:
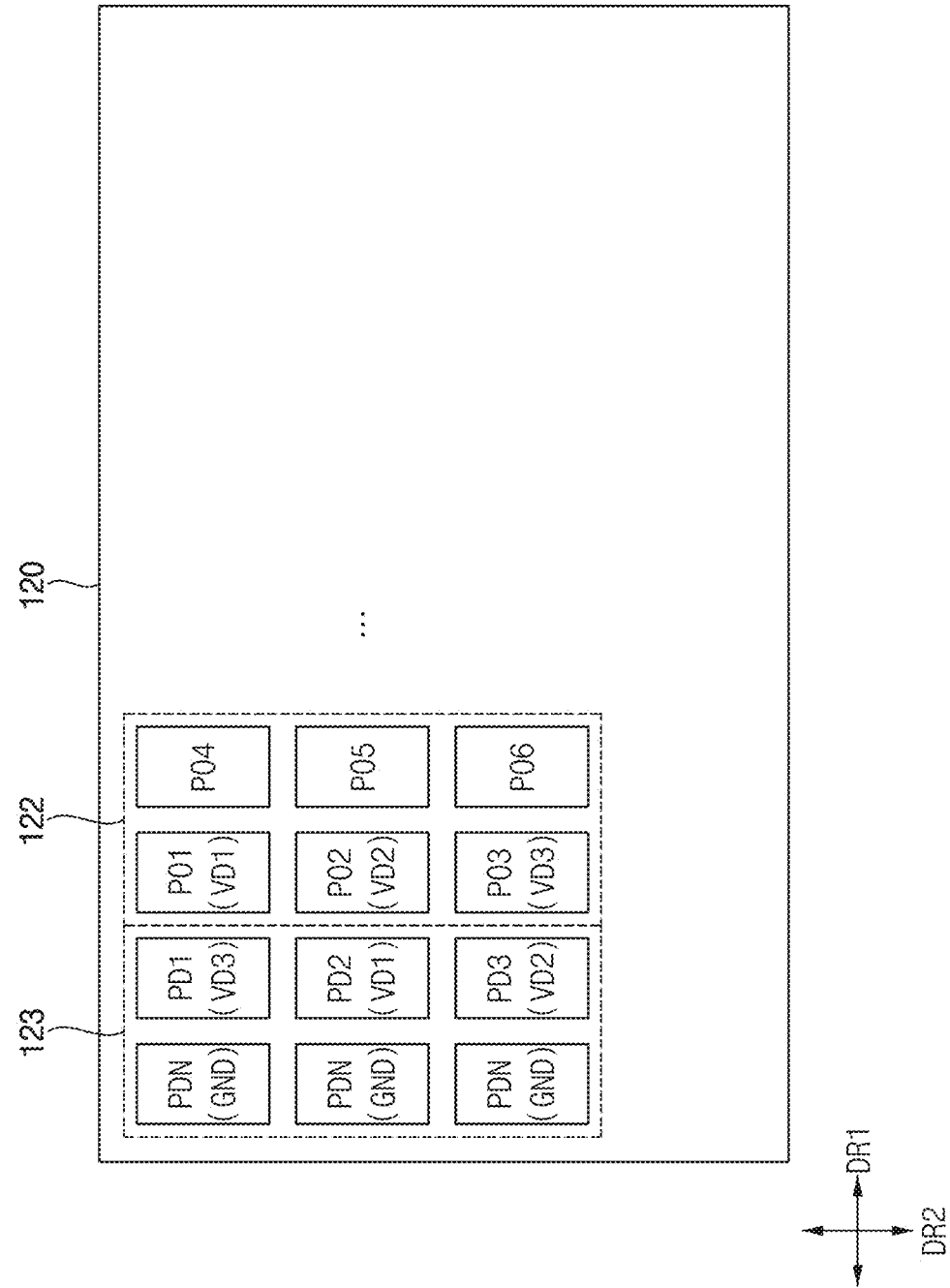
FIG. 8 is a diagram for describing voltages output from dummy pads of a driving chip according to an embodiment.

FIG. 8 is a diagram for describing voltages output from the dummy pads of the driving chip 120 according to an embodiment.

Referring to FIG. 8, the adjacent dummy pads PD1, PD2, and PD3 may include a first adjacent dummy pad PD1, a second adjacent dummy pad PD2, and a third adjacent dummy pad PD3 arranged in the second direction DR2. The output pads PO1, PO2, PO3, PO4, PO5, and PO6 may include a first output pad PO1, a second output pad PO2, and a third output pad PO3 adjacent to the first adjacent dummy pad PD1, the second adjacent dummy pad PD2, and the third adjacent dummy pad PD3 in the first direction DR1, respectively.

In an embodiment, when the first output pad PO1, the second output pad PO2, and the third output pad PO3 output a first data voltage VD1, a second data voltage VD2, and a third data voltage VD3, respectively, the first adjacent dummy pad PD1, the second adjacent dummy pad PD2, and the third adjacent dummy pad PD3 may output the third data voltage VD3, the first data voltage VD1, and the second data voltage VD2, respectively. Accordingly, the adjacent dummy pads PD1, PD2, and PD3 may output variable voltages corresponding to the data voltages VD1, VD2, and VD3 output from the output pads PO1, PO2, and PO3 adjacent thereto.

Figure 9:
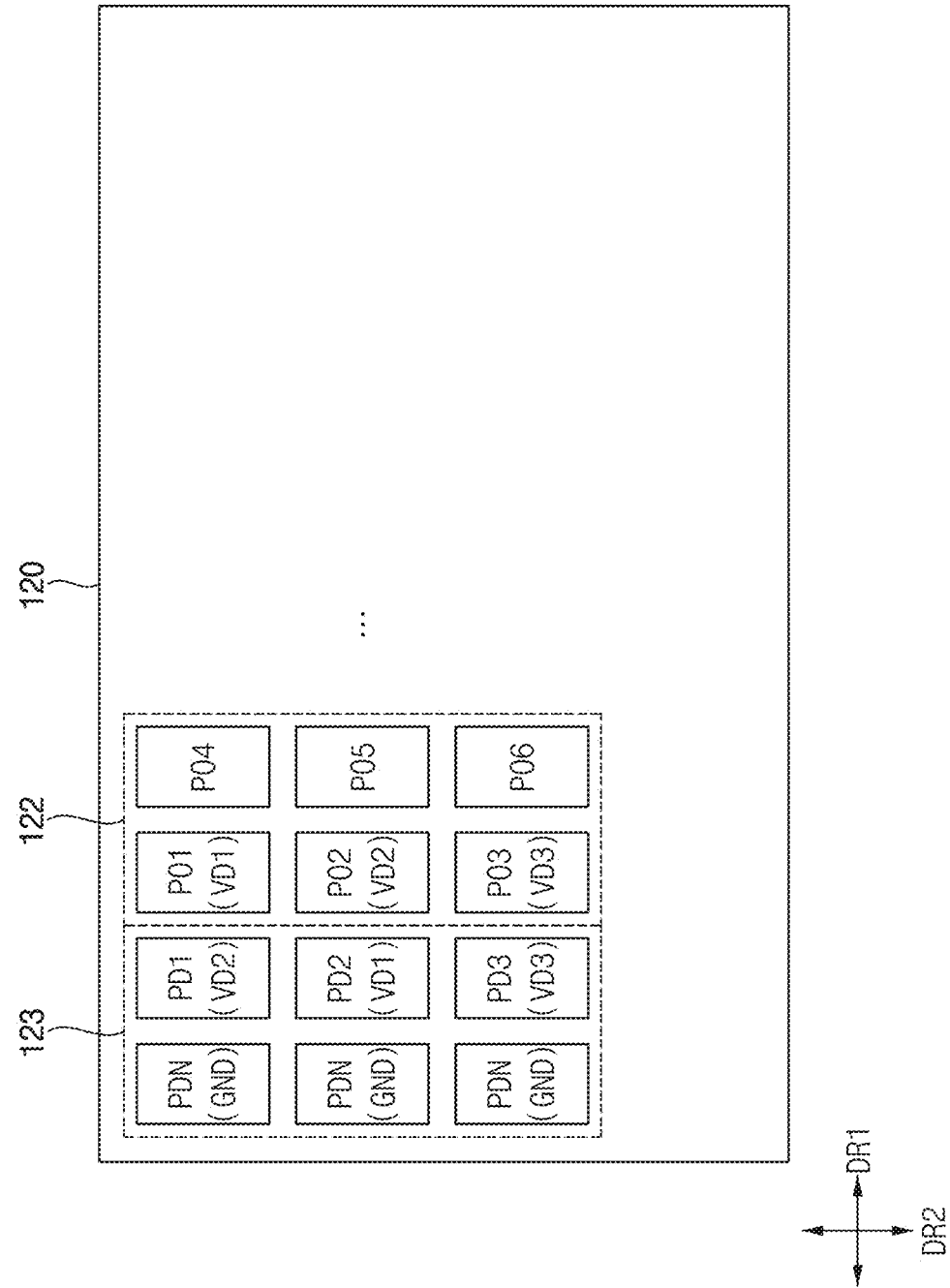
FIG. 9 is a diagram for describing voltages output from dummy pads of a driving chip according to an embodiment.

FIG. 9 is a diagram for describing voltages output from the dummy pads of the driving chip 120 according to an embodiment.

Referring to FIG. 9, in an embodiment, when the first output pad PO1, the second output pad PO2, and the third output pad PO3 output a first data voltage VD1, a second data voltage VD2, and a third data voltage VD3, respectively, the first adjacent dummy pad PD1, the second adjacent dummy pad PD2, and the third adjacent dummy pad PD3 may output the second data voltage VD2, the first data voltage VD1, and the third data voltage VD3, respectively. Accordingly, the adjacent dummy pads PD1, PD2, and PD3 may output variable voltages corresponding to the data voltages VD1, VD2, and VD3 output from the output pads PO1, PO2, and PO3 adjacent thereto.

Figure 10:
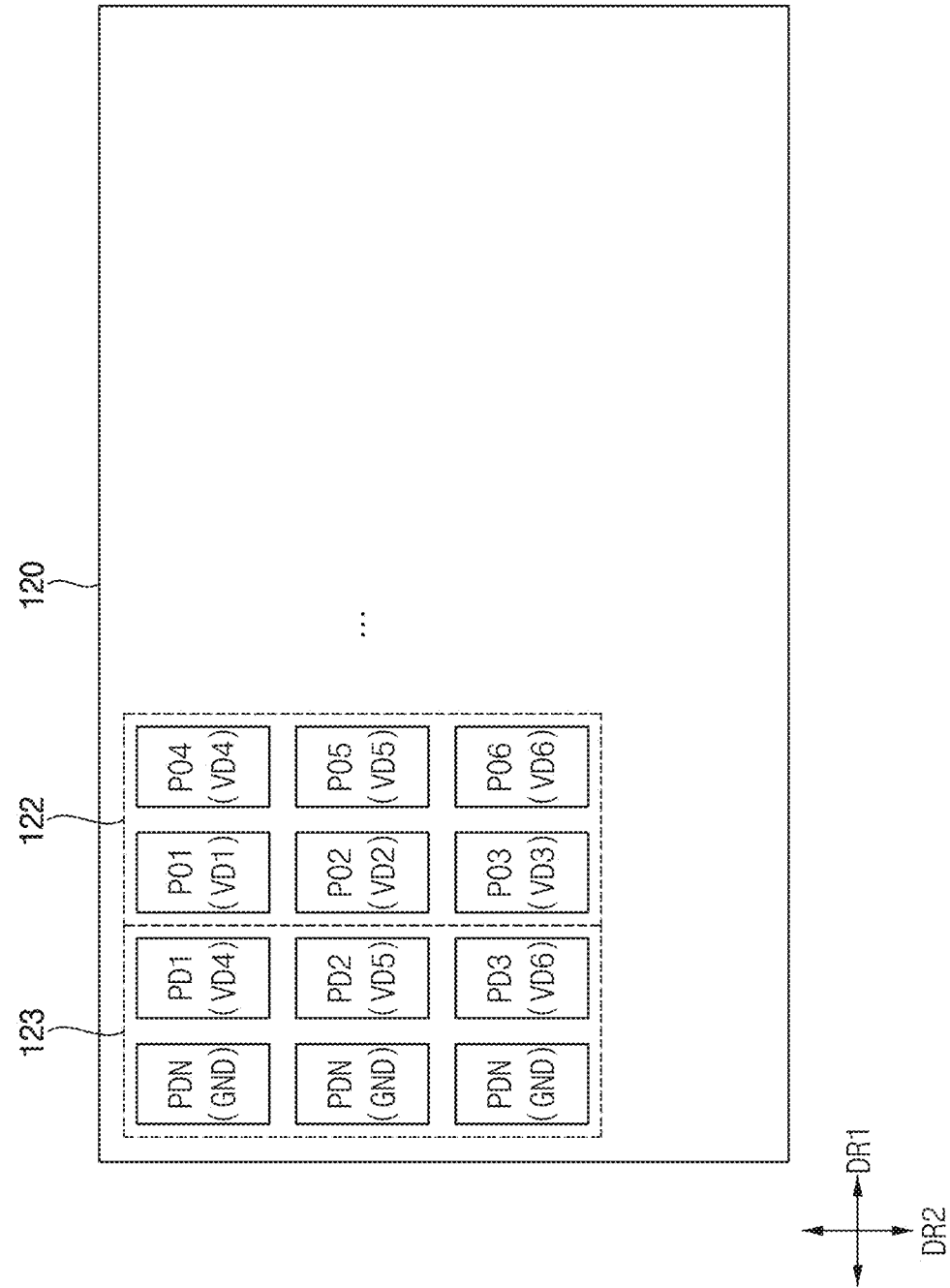
FIG. 10 is a diagram for describing voltages output from dummy pads of a driving chip according to an embodiment.

FIG. 10 is a diagram for describing voltages output from the dummy pads of the driving chip 120 according to an embodiment.

Referring to FIG. 10, in an embodiment, the output pads PO1, PO2, PO3, PO4, PO5, and PO6 may include a fourth output pad PO4, a fifth output pad PO5, and a sixth output pad PO6 adjacent to the first output pad PO1, the second output pad PO2, and the third output pad PO3 in the first direction DR1, respectively. The fourth output pad PO4, the fifth output pad PO5, and the sixth output pad PO6 may be spaced apart from the first adjacent dummy pad PD1, the second adjacent dummy pad PD2, and the third adjacent dummy pad PD3, respectively, with the first output pad PO1, the second output pad PO2, and the third output pad PO3 disposed in between in the first direction DR1.

In an embodiment, when the fourth output pad PO4, the fifth output pad PO5, and the sixth output pad PO6 output a fourth data voltage VD4, a fifth data voltage VD5, and a sixth data voltage VD6, the first adjacent dummy pad PD1, the second adjacent dummy pad PD2, and the third adjacent dummy pad PD3 may output the fourth data voltage VD4, the fifth data voltage VD5, and the sixth data voltage VD6, respectively. Accordingly, the adjacent dummy pads PD1, PD2, and PD3 may output variable voltages corresponding to the data voltages VD4, VD5, and VD6 output from the output pads PO4, PO5, and PO6 spaced apart therefrom with the output pads PO1, PO2, and PO3 adjacent thereto disposed in between.

Figure 11:
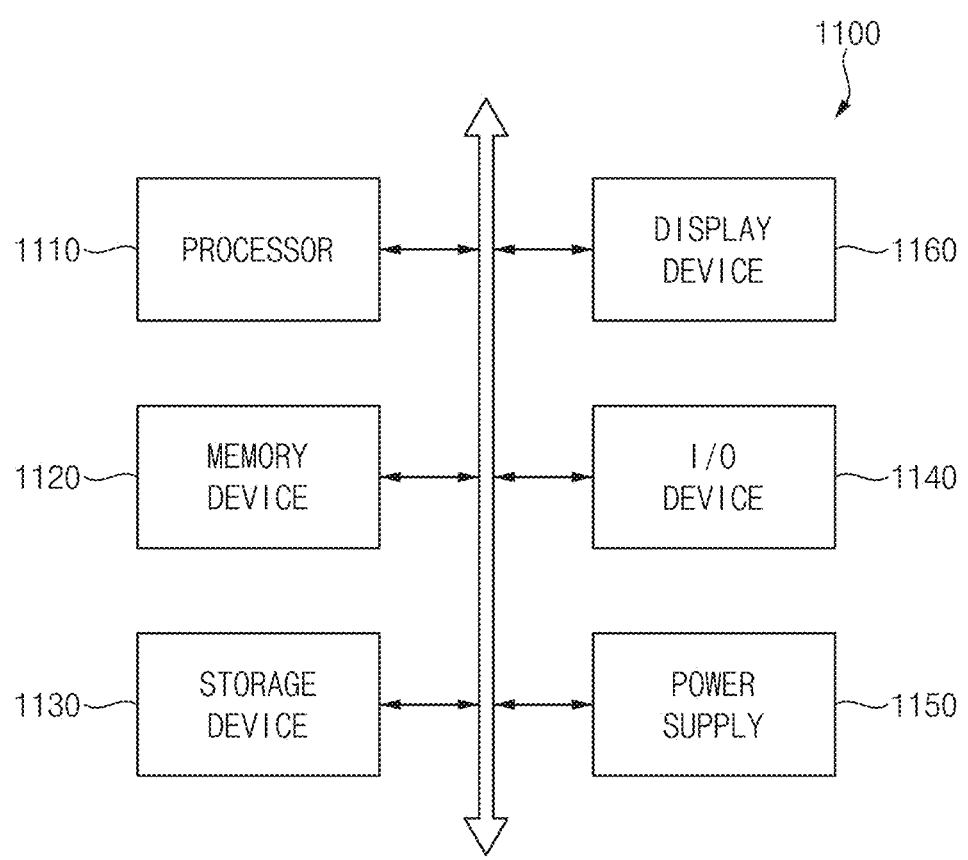
FIG. 11 is a block diagram illustrating an electronic apparatus including a display device according to an embodiment.

FIG. 11 is a block diagram illustrating an electronic apparatus 1100 including a display device 1160 according to an embodiment.

Referring to FIG. 11, an embodiment of the electronic apparatus 1100 may include a processor 1110, a memory device 1120, a storage device 1130, an input/output ("I/O") device 1140, a power supply 1150, and the display device 1160. The display device 1160 may correspond to the display device 100 in FIG. 1. The electronic apparatus 1100 may further include a plurality of ports for communicating with a video card, a sound card, a memory card, a universal serial bus ("USB") device, etc.

The processor 1110 may perform particular calculations or tasks. In an embodiment, the processor 1110 may be a microprocessor, a central processing unit ("CPU"), or the like. The processor 1110 may be coupled to other components via an address bus, a control bus, a data bus, or the like. In an embodiment, the processor 1110 may be coupled to an extended bus such as a peripheral component interconnection ("PCI") bus.

The memory device 1120 may store data for operations of the electronic apparatus 1100. In an embodiment, the memory device 1120 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc.

The storage device 1130 may include a solid state drive ("SSD") device, a hard disk drive ("HDD") device, a CD-ROM device, or the like. The I/O device 1140 may include an input device such as a keyboard, a keypad, a touchpad, a touch-screen, a mouse device, etc., and an output device such as a speaker, a printer, etc. The power supply 1150 may supply a power required for the operation of the electronic apparatus 1100. The display device 1160 may be coupled to other components via the buses or other communication links.

In an embodiment, a driving chip is included in the display device 1160, an adjacent dummy pad of the driving chip adjacent to an output pad among dummy pads may output a variable voltage, so that a contact resistance of an adjacent output pad adjacent to the adjacent dummy pad may not increase. Further, the contact resistance of the adjacent output pad may not increase, so that a vertical line defect in which pixels electrically connected to output pads having increased contact resistance are brightly or darkly viewed may not occur, and a display quality of the display device 1160 may be improved.

The display device according to embodiments may be applied to a display device included in a computer, a notebook, a mobile phone, a smart phone, a smart pad, a personal media player ("PMP"), a personal digital assistant ("PDA"), an MP3 player, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A driving chip, comprising:
a plurality of output pads arranged along a first direction and a second direction crossing the first direction, wherein the plurality of output pads outputs a data voltage to a plurality of panel pads of a display panel; and
a plurality of dummy pads positioned in the first direction from the plurality of output pads and arranged along the first direction and the second direction,
wherein a plurality of adjacent dummy pads adjacent to the plurality of output pads in the first direction, among the plurality of dummy pads, output a variable voltage,
wherein the plurality of output pads includes an adjacent output pad adjacent to an adjacent dummy pad of the plurality of adjacent dummy pads in the first direction, and
wherein the adjacent dummy pad outputs a voltage the same as the data voltage corresponding to a white grayscale when the adjacent output pad outputs the data voltage corresponding to a black grayscale.

2. The driving chip of claim 1, wherein a range of the variable voltage is equal to a range of the data voltage.

3. The driving chip of claim 1, wherein the adjacent dummy pad outputs a voltage the same as the data voltage corresponding to the black grayscale when the adjacent output pad outputs the data voltage corresponding to the white grayscale.

4. The driving chip of claim 1, wherein the adjacent dummy pad outputs a voltage the same as the data voltage corresponding to an intermediate grayscale between the black grayscale and the white grayscale when the adjacent output pad outputs the data voltage corresponding to the intermediate grayscale.

5. The driving chip of claim 1, wherein the plurality of adjacent dummy pads include a first adjacent dummy pad, a second adjacent dummy pad, and a third adjacent dummy pad arranged along the second direction, and
wherein the plurality of output pads include a first output pad, a second output pad, and a third output pad, which are respectively adjacent to the first adjacent dummy pad, the second adjacent dummy pad, and the third adjacent dummy pad in the first direction.

6. The driving chip of claim 5, wherein the first adjacent dummy pad, the second adjacent dummy pad, and the third adjacent dummy pad respectively output a voltage the same as a third data voltage, a voltage the same as a first data voltage, and a voltage the same as a second data voltage when the first output pad, the second output pad, and the third output pad respectively output the first data voltage, the second data voltage, and the third data voltage.

7. The driving chip of claim 5, wherein the first adjacent dummy pad, the second adjacent dummy pad, and the third adjacent dummy pad respectively output a voltage the same as a second data voltage, a voltage the same as a first data voltage, and a voltage the same as a third data voltage when the first output pad, the second output pad, and the third output pad respectively output the first data voltage, the second data voltage, and the third data voltage.

8. The driving chip of claim 5, wherein the plurality of output pads further include a fourth output pad, a fifth output pad, and a sixth output pad respectively adjacent to the first output pad, the second output pad, and the third output pad in the first direction, and wherein the first adjacent dummy pad, the second adjacent dummy pad, and the third adjacent dummy pad respectively output a voltage the same as a fourth data voltage, a voltage the same as a fifth data voltage, and a voltage the same as a sixth data voltage when the fourth output pad, the fifth output pad, and the sixth output pad respectively output the fourth data voltage, the fifth data voltage, and the sixth data voltage.

9. The driving chip of claim 1, wherein a plurality of non-adjacent dummy pads other than the plurality of adjacent dummy pads among the plurality of dummy pads output a ground voltage.

10. A display device, comprising:
a display panel including a plurality of panel pads arranged along a first direction and a second direction crossing the first direction; and
a driving chip including:
a plurality of output pads respectively electrically connected to the plurality of panel pads of the display panel, wherein the plurality of output pads outputs a data voltage to the plurality of panel pads of the display panel; and
a plurality of dummy pads positioned in the first direction from the plurality of output pads and arranged along the first direction and the second direction,
wherein a plurality of adjacent dummy pads adjacent to the plurality of output pads in the first direction, among the plurality of dummy pads, output a variable voltage,
wherein the plurality of output pads includes an adjacent output pad adjacent to an adjacent dummy pad of the plurality of adjacent dummy pads in the first direction, and
wherein the adjacent dummy pad outputs a voltage the same as the data voltage corresponding to a white grayscale when the adjacent output pad outputs the data voltage corresponding to a black grayscale.

11. The display device of claim 10, wherein a range of the variable voltage is equal to a range of the data voltage.

12. The display device of claim 10, wherein the adjacent dummy pad outputs a voltage the same as the data voltage corresponding to the black grayscale when the adjacent output pad outputs the data voltage corresponding to the white grayscale.

13. The display device of claim 10, wherein the adjacent dummy pad outputs a voltage the same as the data voltage corresponding to an intermediate grayscale between the black grayscale and the white grayscale when the adjacent output pad outputs the data voltage corresponding to the intermediate grayscale.

14. The display device of claim 10, wherein the plurality of adjacent dummy pads include a first adjacent dummy pad, a second adjacent dummy pad, and a third adjacent dummy pad arranged along the second direction, and wherein the plurality of output pads include a first output pad, a second output pad, and a third output pad which are respectively adjacent to the first adjacent dummy pad, the second adjacent dummy pad, and the third adjacent dummy pad in the first direction.

15. The display device of claim 14, wherein the first adjacent dummy pad, the second adjacent dummy pad, and the third adjacent dummy pad respectively output a voltage the same as a third data voltage, a voltage the same as a first data voltage, and a voltage the same as a second data voltage when the first output pad, the second output pad, and the third output pad respectively output the first data voltage, the second data voltage, and the third data voltage.

16. The display device of claim 14, wherein the first adjacent dummy pad, the second adjacent dummy pad, and the third adjacent dummy pad respectively output a voltage the same as a second data voltage, a voltage the same as a first data voltage, and a voltage the same as a third data voltage when the first output pad, the second output pad, and the third output pad respectively output the first data voltage, the second data voltage, and the third data voltage.

17. The display device of claim 14, wherein the plurality of output pads further include a fourth output pad, a fifth output pad, and a sixth output pad respectively adjacent to the first output pad, the second output pad, and the third output pad in the first direction, and wherein the first adjacent dummy pad, the second adjacent dummy pad, and the third adjacent dummy pad respectively output a voltage the same as a fourth data voltage, a voltage the same as a fifth data voltage, and a voltage the same as a sixth data voltage when the fourth output pad, the fifth output pad, and the sixth output pad respectively output the fourth data voltage, the fifth data voltage, and the sixth data voltage.

18. The display device of claim 10, wherein a plurality of non-adjacent dummy pads other than the plurality of adjacent dummy pads among the plurality of dummy pads output a ground voltage.

19. An electronic device comprising:
a display panel including a plurality of panel pads arranged along a first direction and a second direction crossing the first direction; and
a driving chip including:
a plurality of output pads respectively electrically connected to the plurality of panel pads of the display panel, wherein the plurality of output pads outputs a data voltage to the plurality of panel pads of the display panel; and
a plurality of dummy pads positioned in the first direction from the plurality of output pads and arranged along the first direction and the second direction,
wherein a plurality of adjacent dummy pads adjacent to the plurality of output pads in the first direction, among the plurality of dummy pads, output a variable voltage,
wherein the plurality of output pads includes an adjacent output pad adjacent to an adjacent dummy pad of the plurality of adjacent dummy pads in the first direction, and
wherein the adjacent dummy pad outputs a voltage the same as the data voltage corresponding to a white grayscale when the adjacent output pad outputs the data voltage corresponding to a black grayscale.

* * * * *